(12) United States Patent
Fulgenico et al.

(10) Patent No.: US 8,658,511 B1
(45) Date of Patent: Feb. 25, 2014

(54) ETCHING RESISTIVE SWITCHING AND ELECTRODE LAYERS

(71) Applicant: Intermolecular Inc., San Jose, CA (US)

(72) Inventors: Frederick Carlos Fulgenico, San Jose, CA (US); Vidyut Gopal, Sunnyvale, CA (US); Jinhong Tong, Santa Clara, CA (US)

(73) Assignee: Intermolecular, Inc., San Jose, CA (US)

( * ) Notice: Subject to any disclaimer, the term of this patent is extended or adjusted under 35 U.S.C. 154(b) by 0 days.

(21) Appl. No.: 13/722,714

(22) Filed: Dec. 20, 2012

(51) Int. Cl.
*H01L 21/20* (2006.01)

(52) U.S. Cl.
USPC .......................................... 438/382; 438/238

(58) Field of Classification Search
USPC .......... 438/238, 381, 382; 257/364, 379, 380, 257/381
See application file for complete search history.

(56) References Cited

U.S. PATENT DOCUMENTS

| | | | |
|---|---|---|---|
| 5,227,013 A | 7/1993 | Kumar | |
| 5,314,578 A | 5/1994 | Cathey | |
| 7,410,748 B2 | 8/2008 | Keller | |
| 7,476,951 B2 | 1/2009 | Campbell et al. | |
| 7,667,293 B2 | 2/2010 | Lee | |
| 7,935,608 B2 | 5/2011 | Heinrichsdorff | |
| 7,981,760 B2 | 7/2011 | Kawashima | |
| 8,114,715 B2 | 2/2012 | Lee | |
| 8,178,388 B2 | 5/2012 | Ho | |
| 2005/0243595 A1* | 11/2005 | Rinerson et al. | 365/148 |
| 2008/0048164 A1* | 2/2008 | Odagawa | 257/2 |
| 2009/0146125 A1 | 6/2009 | Ho | |
| 2013/0187120 A1* | 7/2013 | Redaelli et al. | 257/5 |

OTHER PUBLICATIONS

Gouil, A., et al.; PolySiTiNFfo[sub 2] Gate Stack Etching in HighDensity Plasmas; Jan. 1, 2007; Z—Book-Author; Journal of Vacuum Science and Technology B Microelectronics and Nanometer Structures vol. 25 No. 3. 2007 pp. 767-778.

\* cited by examiner

*Primary Examiner* — Kevin M Picardat

(57) ABSTRACT

Provided are methods for etching resistive switching and electrode layers in resistive random access memory (ReRAM) cells. Both types of layers are etched in the same operation. This approach simplifies processing in comparison to conventional etching, in which each layer is etched individually. The composition of etchants and process conditions are specifically selected to provide robust and effective etching of both types of layers. The two etching rates may be comparable and may be substantially the same, in some embodiments. Plasma etching involving tri-fluoro-methane and oxygen containing etchants may be used on electrode materials, such as titanium nitride, platinum, and ruthenium, and on resistive switching materials, such as oxides of transition metals. For example, a combination of titanium nitride and hafnium oxide may be etched using such processes. In some embodiments, an etched stack includes a third layer, which may function as a current limiter in ReRAM cells.

19 Claims, 8 Drawing Sheets

ETCHING RESISTIVE SWITCHING AND ELECTRODE LAYERS

BACKGROUND

Nonvolatile memory is computer memory capable of retaining the stored information even when unpowered. Nonvolatile memory is typically used for the task of secondary storage or long-term persistent storage and may be used in addition to volatile memory, which loses the stored information when unpowered. Nonvolatile memory can be permanently integrated into computer systems (e.g., solid state hard drives) or can take the form of removable and easily transportable memory cards (e.g., USB flash drives). Nonvolatile memory is becoming more popular because of its small size/high density, low power consumption, fast read and write rates, retention, and other characteristics.

Flash memory is a common type of nonvolatile memory because of its high density and low fabrication costs. Flash memory is a transistor-based memory device that uses multiple gates per transistor and quantum tunneling for storing the information on its memory device. Flash memory uses a block-access architecture that can result in long access, erase, and write times. Flash memory also suffers from low endurance, high power consumption, and scaling limitations.

The constantly increasing speed of electronic devices and storage demand drive new requirements for nonvolatile memory. For example, nonvolatile memory is expected to replace hard drives in some computer systems. However, transistor-based flash memory is often inadequate to meet the requirements of various applications. New types of memory, such as resistive random access memory (ReRAM), are being developed to meet these demands and requirements.

SUMMARY

Provided are methods for etching resistive switching and electrode layers in resistive random access memory (ReRAM) cells. The methods may be used for evaluation of different materials in the testing context and/or in the production. Both types of layers are etched in the same operation. This approach simplifies processing in comparison to conventional etching, in which each layer is etched individually. The composition of etchants and process conditions are specifically selected to provide robust and effective etching of both types of layers. The two etching rates may be comparable and may even be substantially the same, in some embodiments. Plasma etching involving tri-fluoro-methane and oxygen containing etchants may be used on electrode materials, such as titanium nitride, platinum, and ruthenium, and on resistive switching materials, such as oxides of transition metals. For example, a combination of titanium nitride and hafnium oxide may be etched using such processes. In some embodiments, an etched stack includes a third layer, which may function as a current limiter in ReRAM cells.

In some embodiments, a method of forming a resistive random access memory cell involves providing a semiconductor substrate having a stack. The stack may include a first layer and a second layer. The stack may be provided into a processing chamber. The first layer may include a resistive switching material, while the second layer comprising an electrode material. A combination of the resistive switching material and the electrode material facilitates resistive switching characteristics of the resistive random access memory cell. The method may proceed with removing portions of the stack in a plasma environment formed in the processing chamber from process gases that include tri-fluoro-methane and an oxygen containing compound. The removed portions expose portions of the semiconductor substrate in between remaining portions of the stack. In some embodiments, the substrate includes multiple stacks having different composition and/or thicknesses of the first layer and/or the second layer. For example, the substrate may be used for evaluation of different materials for these layers using combinatorial methodology.

In some embodiments, a ratio of a first layer etch rate to a second layer etch rate is between 0.1 and 10. The first layer etch rate and the second layer etch rate may each be between about 20 Angstroms per minute and 120 Angstroms per minute. In some embodiments, the first layer etch rate is greater than the second layer etch rate. The oxygen containing compound may include molecular oxygen. The removing operation may be performed at a temperature of between 20° C. and 30° C. In some embodiments, a flow rate of tri-fluoro-methane is greater than a flow rate of the oxygen containing compound. For example, the flow rate of tri-fluoro-methane may be twice the flow rate of the oxygen containing compound.

In some embodiments, the resistive switching material includes one or more of hafnium oxide, titanium oxide, aluminum oxide, zirconium oxide, niobium oxide, tantalum oxide, or yttrium oxide. The electrode material may include one or more of titanium nitride, platinum, or ruthenium. For example, the resistive switching material may include hafnium oxide, while the electrode material may include titanium nitride. In some embodiments, the stack further includes a third layer disposed between the first layer and the second layer. The third layer may include a current limiter material.

In some embodiments, the semiconductor substrate includes electrode structures, such that each of the remaining portions of the stack is positioned over one of the electrode structures. The electrode structures may include doped polysilicon. Each of the remaining portions of the stack fully may cover one of the electrode structures.

In some embodiments, the first layer has a thickness of between 20 Angstroms and 400 Angstroms. The second layer may have a thickness of between 400 Angstroms and 1200 Angstroms. The stack may include a photoresist pattern covering only the remaining portions.

In some embodiments, a method of forming a resistive random access memory cell involves providing a substrate including a stack into a processing chamber. The stack includes a first layer, a second layer, and electrode structures. The electrode structures may include doped polysilicon. The first layer includes one or more of hafnium oxide, titanium oxide, aluminum oxide, zirconium oxide, niobium oxide, tantalum oxide, or yttrium oxide. The first layer may have a thickness of between 20 Angstroms and 400 Angstroms. The second layer includes one or more of titanium nitride, platinum, or ruthenium. The second layer may have a thickness of between 400 Angstroms and 1200 Angstroms. The first layer and the second layer may facilitate resistive switching characteristics of the resistive random access memory cell.

The method may proceed with removing portions of the stack in a plasma environment formed in the processing chamber from process gases. The process gases may include tri-fluoro-methane and an oxygen containing molecular oxygen. The flow rate of tri-fluoro-methane may be greater than a flow rate of the oxygen containing compound. The removed portions expose portions of the semiconductor substrate in between remaining portions of the stack, while each of the remaining portions of the stack fully covers one of the electrode structures.

These and other embodiments are described further below with reference to the figures.

DETAILED DESCRIPTION OF EXAMPLE EMBODIMENTS

Figure 1A:
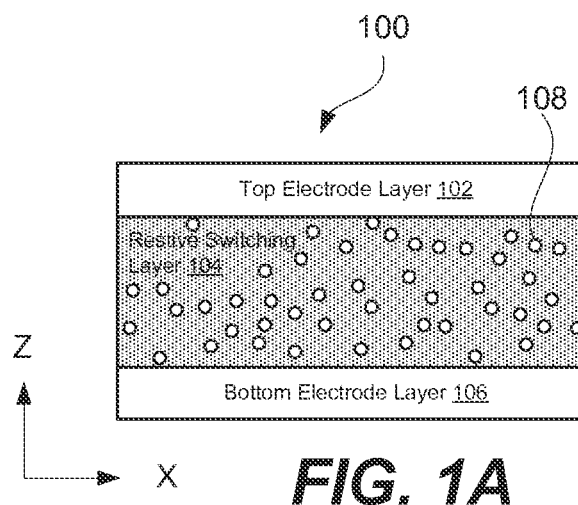
FIGS. 1A and 1B illustrate schematic representations of a ReRAM cell in a high resistive state (HRS) and low resistive state (LRS), in accordance with some embodiments.

In the following description, numerous specific details are set forth in order to provide a thorough understanding of the presented concepts. The presented concepts may be practiced without some or all of these specific details. In other instances, well known process operations have not been described in detail so as to not unnecessarily obscure the described concepts. While some concepts will be described in conjunction with the specific embodiments, it will be understood that these embodiments are not intended to be limiting.

Introduction

A ReRAM cell exhibiting resistive switching characteristics generally includes multiple layers formed into a stack. This stack is often referred to as a Metal-Insulator-Metal (MIM) stack. The stack includes two conductive layers operating as electrodes, which may include metals and other conductive materials, such as doped silicon. These conductive layers are identified as "M" in the above naming convention. The stack also includes a resistive switching layer, which is made from less conductive materials than the electrodes. As such, this layer is labeled as "I" for an insulator. This layer exhibits resistive switching properties characterized by different resistive states, which may be used to store one or more bits of information. For example, one resistive state may be used to represent a logical "zero," while another resistive state may be used to represent a logical "one." The difference in the resistive states may be attributed to changes in the insulator layer, changes at one or both interfaces between the insulator layer and metal layers, or both types of changes. The stack may also include other layers as further described above, such as a current limiting layer, a current steering layer, a barrier layer, and the like.

A typical semiconductor process involves individual etching of each layer forming ReRAM cells. Different etchant compositions are optimized for each one of the different materials based on selectivity of etchants and other considerations. As a result, multiple steps and, in some cases, different processing chambers are necessary to etch multiple layers. In a ReRAM stack including three different layers, three different etching operations would be typically involved. Often, ReRAM cells include additional layers that form current steering and/or current limiting elements. This individual etching approach leads to high operation, material, and facility costs. For example, different sets of processing gases and possibly different processing chambers may be needed for etching a resistive switching layer and, separately, one of the electrodes. Furthermore, specific over-etching prevention techniques may be needed, in particular when one set of etchants is particularly aggressive.

Provided methods involve etching resistive switching and electrode layers in the same operation using the same set of etchants and process parameters. Specifically, a stack including a top electrode and a resistive switching layer may be etched in one operation. In some embodiments, the stack also includes another layer (i.e., the third layer), which may function, for example, as a current limiter in the ReRAM cell. This approach may be used with top electrodes made from titanium nitride, platinum, and ruthenium. The resistive switching layers may include oxides of transition metals, such as hafnium oxide, titanium oxide, aluminum oxide, zirconium oxide, niobium oxide, tantalum oxide, and yttrium oxide. For example, a stack including a hafnium oxide layer and a titanium nitride layer may be etched in the same operation.

Plasma etching techniques may be used for simultaneous etching of multiple layers. Specifically, a plasma generated form of an appropriate gas mixture may be delivered to a substrate surface containing at least a top electrode layer and a resistive layer for etching these layers in the same operation. The etch species in plasma may be charged (ions) and/or neutral (atoms and radicals). During etching, the plasma reacts with different materials in these layer and generates volatile etch products. The reaction may be performed at a room temperature or at elevated temperatures. A plasma system may be used to ionize process gases by employing RF excitations. The operating frequency may be 13.56 MHz. Other frequencies can be used as well.

Plasma allows generating reactive species. Without the assistance of the plasma, much higher temperature would be required to achieve the same etch rates and/or etch selectivity. The low processing temperatures are possible because the plasma generates atoms, molecular radicals, and charged ions that are more chemically reactive than the normal molecular gases, from which the species are created. In some embodiments, the etching temperatures are about the room temperature (i.e., between about 20° C. and 30° C.). Other temperatures may be used as well.

ReRAM Examples

A brief description of ReRAM cells is presented below to provide better understanding of materials used in constructions of ReRAM cells. A basic building unit of a ReRAM cell is a stack having a capacitor like structure. The ReRAM cell includes two electrodes and a dielectric material positioned in between these two electrodes. FIG. 1A illustrates a schematic representation of ReRAM cell 100 including top electrode 102, bottom electrode 106, and resistive switching layer 104 provided in between top electrode 102 and bottom electrode 106. It should be noted that the "top" and "bottom" references for electrodes 102 and 106 are used solely to differentiation the electrodes and not to imply any particular spatial orientation of the electrodes. In some examples, examples other references, such as "first" and "second" electrodes, are used instead. ReRAM cell 100 may also include other components such as an embedded resistor, diode, and other components.

As discussed above, resistive switching layer 104, which may be made of dielectric material, can be made to conduct through one or more filaments or conduction paths formed by applying a certain voltage. To provide this resistive switching functionality, resistive switching layer 104 includes a certain concentration of electrically active defects 108, which are sometimes referred to as traps. For example, some charge carriers may be absent from the structure (i.e., vacancies) and/or additional charge carriers may be present (i.e., interstitials) representing defects 108. In some embodiments, defects may be formed by impurities (i.e., substitutions). These defects may be utilized for ReRAM cells operating according to a valence change mechanism, which may occur in specific transition metal oxides and is triggered by a migration of anions, such as oxygen anions. Migrations of oxygen anions may be represented by the motion of the corresponding vacancies, i.e., oxygen vacancies. A subsequent change of the stoichiometry in the transition metal oxides leads to a redox reaction expressed by a valence change of the cation sublattice and a change in the electronic conductivity. In this example, the polarity of the pulse used to perform this change determines the direction of the change, i.e., reduction or oxidation. Other resistive switching mechanisms include bipolar electrochemical metallization mechanism and thermochemical mechanism, which leads to a change of the stoichiometry due to a current-induced increase of the temperature.

Figure 1B:
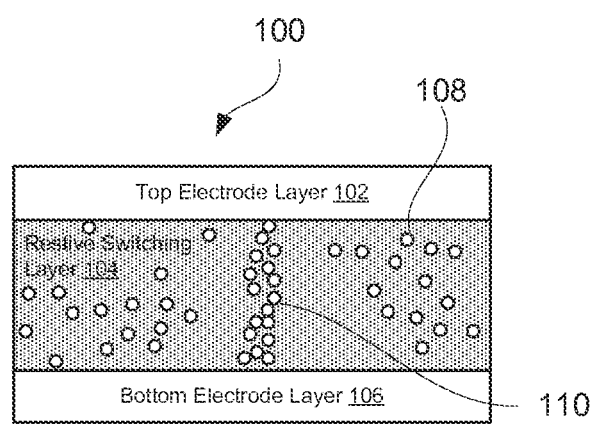

Without being restricted to any particular theory, it is believed that defects 108 can be reoriented within resistive switching layer 104 to form filaments or conduction paths as, for example, schematically shown in FIG. 1B as element 110. This reorientation of defects 108 occurs when a voltage for this type of resistive switching layer 104 is applied to electrodes 102 and 106. Sometimes, reorientation of defects 108 is referred to as filling the traps by applying a set voltage (and forming one or more filaments or conduction paths) and emptying the traps by applying a reset voltage (and breaking the previously formed filaments or conduction paths).

Defects 108 can be introduced into resistive switching layer 104 during or after its fabrication. For example, a certain concentration of oxygen deficiencies can be introduced into metal oxides during their deposition or during subsequent annealing. Physical vapor deposition (PVD) and atomic layer deposition (ALD) techniques may be specifically tuned to include particular defects 108 and their distribution within resistive switching layer 104. Doping and other techniques could be also used to create defects 108 in resistive switching layer 104.

Figure 1C:
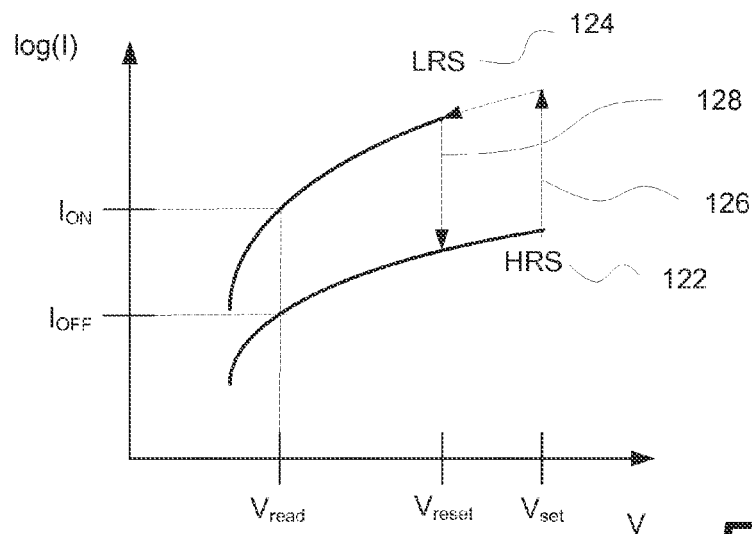
FIGS. 1C and 1D illustrate plots of a current through a ReRAM cell (unipolar and bipolar) as a function of a voltage applied to the ReRAM cell, in accordance with some embodiments.
Figure 1D:
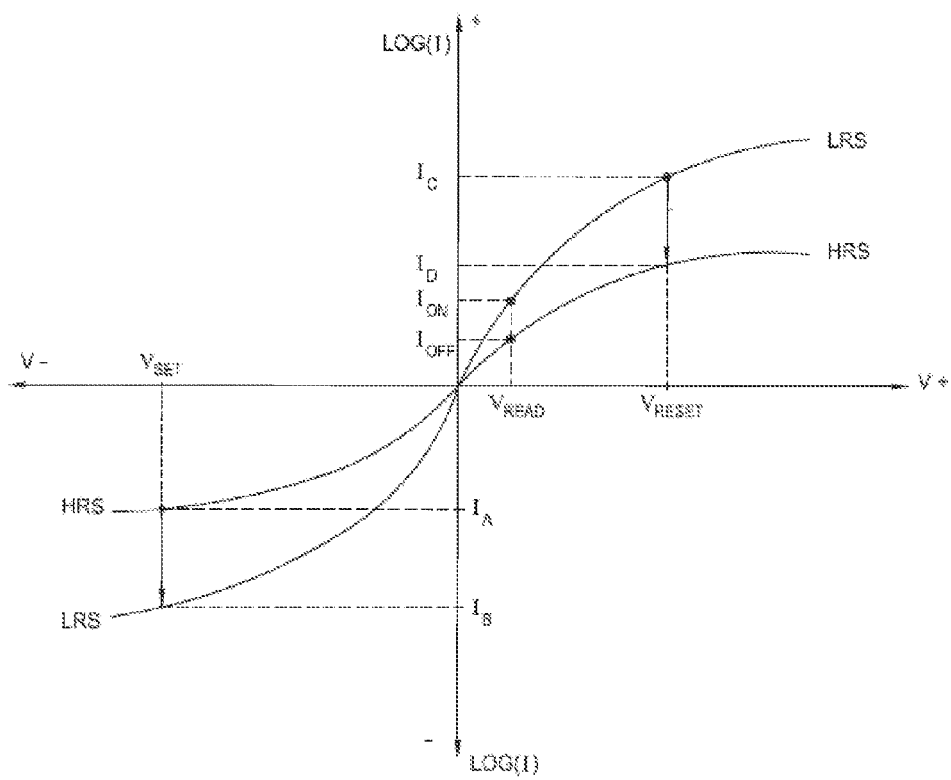

Operation of ReRAM cell 100 will now be briefly described with reference to FIGS. 1C and 1D illustrating logarithmic plots of a current through a ReRAM cell as a function of a voltage applied to the electrode of the ReRAM cell, in accordance with some embodiments. Specifically, FIG. 1C represent unipolar switching of a ReRAM cell, while FIG. 1D represents a bipolar switching.

ReRAM cell 100 may be either in a low resistive state (LRS) defined by line 124 or high resistive state (HRS) defined by line 122. Each of these states is used to represent a different logic state, e.g., HRS representing logic one and LRS representing logic zero or vice versa. Therefore, each ReRAM cell may be used to store one bit of data. It should be noted that some ReRAM cells may have three and even more resistive states allowing multiple bit storage in the same stack. One having ordinary skills in the art would understand application of this example to more complex ReRAM cell architectures.

HRS and LRS are defined by presence or absence of one or more filaments or conduction paths in a resistive switching layer a ReRAM cell. For example, a ReRAM cell may be initially fabricated in LRS and then switched to HRS. The ReRAM cell may be switched back and forth between LRS and HRS many times, defined by set and reset cycles. Furthermore, the ReRAM cell may maintain its LRS or HRS for a substantial period of time and withstand a number of read cycles.

The overall operation of a ReRAM cell may be divided into a read operation, set operation, and reset operation. During the read operation, the state of the ReRAM cell or, more specifically, the resistance of its resistive switching layer can be sensed by applying a sensing voltage to its electrodes. The sensing voltage is sometimes referred to as a "read" voltage and indicated as $V_{READ}$ in FIG. 1C. If the ReRAM cell is in its HRS at the time of reading (as represented by line 122), then the external read and write circuitry connected to electrodes 102 and 106 will sense the resulting "off" current ($I_{OFF}$) that flows through ReRAM cell 100. As stated above, this read operation may be performed multiple times without switching ReRAM cell 100 between HRS and LRS. In the above example, the ReRAM cell 100 should continue to output the "off" current ($I_{OFF}$) when the read voltage ($V_{READ}$) is applied to the electrodes.

Continuing with the above example, when it is desired to switch ReRAM cell 100 into a different logic state, ReRAM cell 100 is switched from its HRS to LRS. This operation is referred to as a set operation. This may be accomplished by using the same read and write circuitry to apply a set voltage ($V_{SET}$) to electrodes 102 and 106. Applying the set voltage ($V_{SET}$) forms one or more filaments or conduction paths in resistive switching layer 104 and switches ReRAM cell 100 from its HRS to LRS as indicated by dashed line 126. In LRS, the resistance characteristics of ReRAM cell 100 are represented by line 124. In this LRS, when the read voltage ($V_{READ}$) is applied to electrodes 102 and 106, the external read and write circuitry will sense the resulting "ON" current ($I_{ON}$) that flows through ReRAM cell 100. Again, this read operation may be performed multiple times without toggling ReRAM cell 100 between HRS and LRS. ReRAM cell 100 being in LRS, ReRAM cell 100 should continue to output the "OFF" current ($I_{OFF}$) when the read voltage ($V_{READ}$) is applied to the electrodes.

It may be desirable to switch ReRAM cell 100 into a different logic state again by switching ReRAM cell 100 from its LRS to HRS. This operation is referred to as a reset operation and should be distinguished from set operation during which ReRAM cell 100 is switched from its HRS to LRS. During the reset operation, a reset voltage ($V_{RESET}$) is applied to resistive switching layer 104 to break the previously formed filaments or conduction paths in resistive switching layer 104 and switches ReRAM cell 100 from its LRS to HRS as indicated by dashed line 128. Reading of ReRAM cell 100 in its HRS is described above. Overall, ReRAM cell 100 may be switched back and forth between its LRS and HRS many times. Read operations may be performed in each of these states (between the switching operations) one or more times or not performed at all.

ReRAM cell 100 may be configured to have either unipolar switching or bipolar switching. The unipolar switching does not depend on the polarity of the set voltage ($V_{SET}$) and reset voltage ($V_{RESET}$) applied to the electrodes 102 and 106 and, as a result, to resistive switching layer 104. As such, unipolar ReRAM cells may be read and switched in accordance with the plot illustrated in FIG. 1C or the plot illustrated in FIG. 1D. The bipolar switching requires the set voltage ($V_{SET}$) and reset voltage ($V_{RESET}$) to have different polarities. As such, bipolar ReRAM cells may be read and switched in accordance with the plot illustrated in FIG. 1D (but not in accordance with the plot illustrated in FIG. 1C).

In some embodiments, the write voltage ($V_{WRITE}$) is between about 100 mV and 10V or, more specifically, between about 500 mV and 5V. The length of write voltage pulses ($t_{WRITE}$) may be less than about 100 milliseconds or, more specifically, less than about 5 milliseconds and even less than about 100 nanoseconds. The read voltage ($V_{READ}$) may be between about 0.1 and 0.5 of the write voltage ($V_{WRITE}$). In some embodiments, the current during reading operations is greater than about 1 mA or, more specifically, is greater than about 5 mA to allow for a fast detection of the state by reasonably small sense amplifiers. The length of read voltage pulse ($t_{READ}$) may be comparable to the length of the corresponding write voltage pulse ($t_{WRITE}$) or may be shorter than the write voltage pulse ($t_{WRITE}$).

In some embodiments, a set voltage ($V_{SET}$) and resent voltage ($V_{RESET}$) dependent on the thickness of resistive switching layer 104. Without being restricted to any particular theory it is believed that this behavior is indicative of a bulk-mediated switching mechanism. Generally, the bulk-mediated switching mechanism forms percolation paths through the bulk of resistive switching layer 104. Materials exhibiting this behavior include higher bandgap metal oxides (i.e., oxides with a bandgap greater than 4 eV), such as hafnium oxide, aluminum oxide, tantalum oxide, zirconium oxide, and yttrium oxide. It should be noted that these oxides includes specifically formed defects and therefore are distinguishable from typical oxides of these metals, e.g., stoichiometric oxides containing no impurities. As such, it is possible to reduce required voltages by scaling down the thickness of resistive switching layer 104. Other materials, such as titanium oxide and niobium oxide, require substantially the same set and reset voltages over a wide span of their thicknesses.

Structural Features of ReRAM Cells

Figure 2:
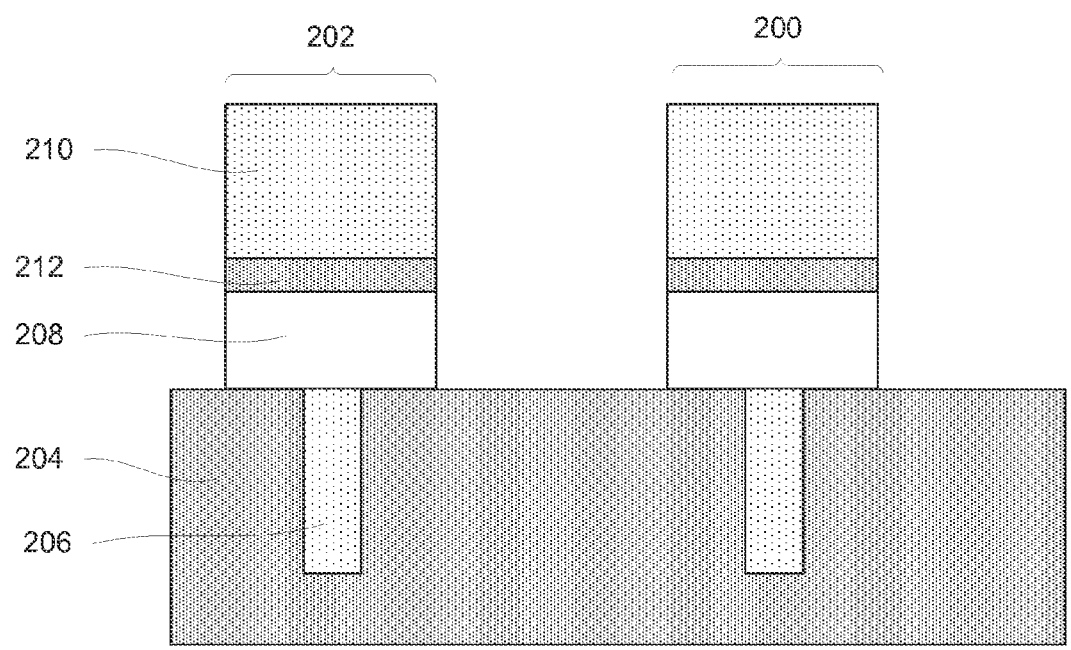
FIG. 2 illustrates two ReRAM cells provided on the same substrate, in accordance with some embodiments.

Additional structural features of ReRAM cells will now be described with reference to FIG. 2. Specifically, FIG. 2 illustrates two ReRAM cells 200 and 202 provided on substrate 204, in accordance with some embodiments. ReRAM cells 200 and 202 as well as other cells (not shown) provided on the same substrate 204 may be formed from the same set of layers. For example, bottom electrodes of these cells may be formed by lithographically etching the same layer containing electrode materials. As such, the corresponding components of all cells (e.g., all bottom electrodes, all switching layers, all top electrodes, etc.) provided on the same substrate may have the same thickness and composition. In some embodiments, profiles of these components within a plane parallel to the substrate surface may be substantially the same.

ReRAM cell 202 includes bottom electrode 206, resistive switching layer 208, and top electrode 210. FIG. 2 also illustrates layer 212 disposed between top electrode 210 and resistive switching layer 208. Layer 212 is optional and may not be present in some embodiments. Layer 212 may be operable as a current limiting layer. Various features of layer 212 are further described below.

Bottom electrode 206 is generally formed from a conductive material that has a desirable conductivity and work function. In some embodiments, bottom electrode 206 is formed from doped polysilicon, such as p-doped polysilicon or n-doped polysilicon. Bottom electrode 206 and top electrode 210 are typically made from different materials. Materials for top electrode 210 are selected such that this electrode can be etched while etching resistive switching layer 208. In some embodiments, top electrode 210 is formed from a metal, metal alloy, metal nitride or metal carbide formed from one or more of titanium (Ti), tungsten (W), tantalum (Ta), cobalt (Co), molybdenum (Mo), nickel (Ni), vanadium (V), hafnium (Hf) aluminum (Al), copper (Cu), platinum (Pt), palladium (Pd), iridium (Ir), ruthenium (Ru), or combinations thereof. The thickness of bottom electrode 206 and/or top electrode 210 may be between about 50 Angstroms and 5000 Angstroms each or, more specifically, between about 400 Angstroms and 1200 Angstroms.

Resistive switching layer 208 may be formed from a dielectric material, such as a metal oxide material or other similar material. This material can be switched between at least two or more stable resistive states. In some embodiments, resistive switching layer 208 is a high bandgap material (e.g., bandgap >4 electron volts (eV)), such as hafnium oxide ($Hf_xO_y$), tantalum oxide ($Ta_xO_y$), aluminum oxide ($Al_xO_y$), lanthanum oxide ($La_xO_y$), yttrium oxide ($Y_xO_y$), dysprosium oxide ($Dy_xO_y$), ytterbium oxide ($Yb_xO_y$) and zirconium oxide ($Zr_xO_y$). Using high band gap resistive switching layer materials may improve data retention in a ReRAM cell, and reduce the leakage current in the formed memory element device, since the amount of trapped charge in the resistive switching layer material will be less than a lower band gap material, and the high band gap materials create a large barrier height that the carriers have to cross during the read, "set" and "reset" operations. In other embodiments, lower bandgap metal oxide materials can be used, such as titanium oxide ($TiO_x$), nickel oxide ($NiO)_x$ or cerium oxide ($CeO_x$) may be advantageous. In some cases, a semiconductive metal oxide (p-type or n-type) such as zinc oxides ($Zn_xO_y$), copper oxides ($Cu_xO_y$), and their nonstoichiometric and doped variants can be used. Resistive switching layer 208 may have a thickness of between about 10 and about 400 Angstroms or, more specifically, between about 20 Angstroms and 400 Angstroms. In some embodiments, resistive switching layer 208 is doped with a material that has an affinity for oxygen (e.g., transition metals (Al, Ti, Zr)) to form a metal-rich resistive switching layer (e.g., $HfO_{1.7}$ vs. $HfO_2$), which is deficient in oxygen, and thus has a larger number of oxygen vacancy type defects. The additional vacancy defects can reduce the required switching and forming voltages, reduce the device operating current(s), and reduce the device to device variation in a formed memory element.

Resistive switching layer 208 can be deposited using any desired technique, but in some embodiments described herein is deposited using an ALD process. In other embodiments, resistive switching layer 208 can be deposited using a CVD (e.g., LPCVD, PECVD) or ALD (e.g., PEALD), physical vapor deposition (PVD), liquid deposition processes, or epitaxial processes. It is believed that PEALD processes can be used to control defects and improve switching and forming voltages in some embodiments. In one example, an ALD process using tetrakis(dimethylamino)hafnium (TDMAH) and an oxygen containing precursor at a temperature of about 250° C. is used to form an 50 Angstroms thick hafnium oxide ($Hf_xO_y$) containing resistive switching layer 208.

Layer 212, if one is present, may be operable as a current limiting layer. In some embodiments, a material of the current limiting layer has a suitable work function for controlling the electron flow through the cell. This specific selection may alter the magnitude of the generated $I_{ON}$ and $I_{OFF}$. In some embodiments, layer 212 is used to increase or decrease the formed barrier height at the interface with resistive switching layer 208. This feature is used to improve current flow characteristics and reduce the magnitude of the $I_{ON}$ and $I_{OFF}$ currents. It should be noted that these changes in the barrier height will generally not affect the current ratio ($I_{ON}/I_{OFF}$), and thus not impact detectability of different resistive states.

To achieve desirable electrical and/or physical properties of layer 212, its composition, structure, and/or deposition conditions may be specifically controlled. In some embodiments, layer 212 is between about 50 Angstroms and 1000 Angstroms thick, such as between about 50 Angstroms and 200 Angstroms. Layer 212 may be formed from a material that has a resistivity of between about 5 Ohm-cm and 500 Ohm-cm, such as between about 50 Ohm-cm and 150 Ohm-cm. In some embodiments, the current limiting layer is formed such that its resistance ($R_{RL}$) is between about 10 kilo-Ohm and about 10 mega-Ohm, such as between about 100 kilo-Ohm and about 1 mega-Ohm.

Resistivity of layer 212 can be controlled by adjusting the composition of the material. Some specific examples, include adding alloying elements or doping atoms and/or adjusting the morphological structure of the materials, (e.g., shifting from amorphous to crystal structure). In some embodiments, a current limiting layer may include titanium oxide doped with niobium, tin oxide doped with antimony, or zinc oxide doped with aluminum. The concentration of dopant materials in the base material may be between about 0.5 and 25 atomic % or, more specifically, between about 1 and 10 atomic %. Other examples of materials suitable for layer 212 include titanium nitride ($Ti_xN_y$), tantalum nitride ($Ta_xN_y$), silicon nitride (SiN), hafnium nitride ($Hf_xN_y$) or titanium aluminum nitride ($Ti_xAl_yN_z$) layer. Such layers may be formed using an ALD, CVD or PVD process as further described below.

Processing Examples

Figure 3:
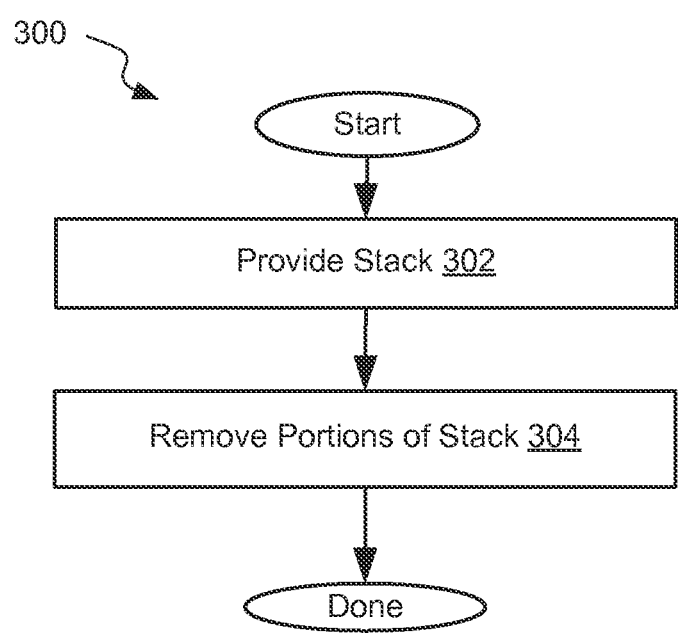
FIG. 3 illustrates a process flowchart corresponding to a method of forming resistive random access memory cells on the same substrate, in accordance with some embodiments.

FIG. 3 illustrates a process flowchart corresponding to a method 300 of forming a ReRAM cell, in accordance with some embodiments. Method 300 may commence with providing a stack into a processing chamber during operation 302. One example of a suitable processing chamber includes a plasma etcher, such as capacitive or inductively coupled reactive-ion etching (RIE). It can be a stand-alone chamber having a cylindrical vacuum chamber, RF power, and etchant gases that feed through the top. Parameters such as pressure, RF power, and temperature can determine process conditions.

Figure 4A:
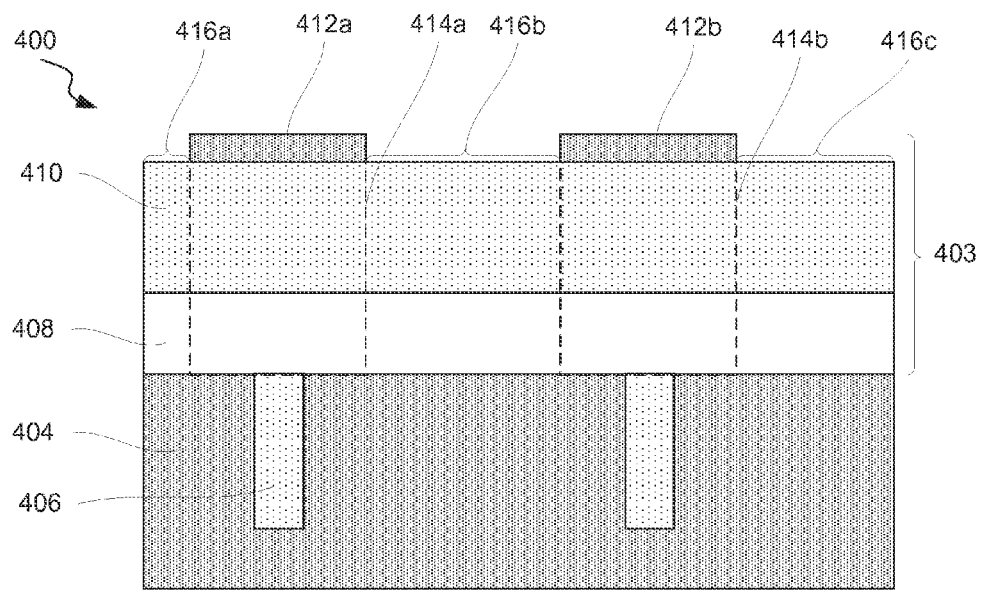
FIGS. 4A and 4B illustrate a substrate during different stages of fabricating ReRAM cells on that substrate, in accordance with some embodiments.

An example of the stack provided into the chamber during operation 302 will now be described with reference to FIG. 4A. Specifically, FIG. 4A illustrates a semiconductor substrate 400 including a stack 403. Semiconductor substrate 400 includes multiple electrode structures 406 provided within the substrate and under stack 403. These electrode structures 406 will serve as bottom electrodes in subsequently formed ReRAM cells.

In some embodiments, different electrode structures belong to different site isolation regions that are processed combinatorial using High Productivity Combinatorial™ (HPC™) (High Productivity Combinatorial™ and HPC™ are trademarks of Intermolecular, Inc.), which is a promising approach that allows testing different samples on the same semiconductor substrate. This approach increases testing throughput and likelihood of finding optimum materials for various applications, such as Resistive Random Access Memory (ReRAM). HPC methodology involves parallel processing of multiple site isolated regions provided on a substrate. Each site isolated region may be used for testing different materials and/or processing conditions. For example, a ReRAM cell may include two electrodes and a resistive switching layer provided between the two electrodes. In a typical production process, each one of these components is formed from a separate blanket layer that initially covers the entire substrate. As such, multiple ReRAM cells fabricated on the same substrate have the same composition, thickness, and are processed using the same conditions. The HPC approach allows varying one or more of these characteristics of one or more components among different site isolated regions provided in the same substrate. For example, test samples used to form resistive switching layers in ReRAM cells may have different compositions in different site isolated regions. As such, ReRAM cells will differ throughout the substrate. Additional features of the HPC methodology are described below with reference to FIGS. 6A and 6B.

Stack 403 includes a first layer 408 and a second layer 410. These layers may be continuous layers extending over multiple electrode structures 406 and, in some embodiments, over the entire surface of substrate 404 (at least prior to etching of these layers). First layer 408 includes one or more resistive switching materials, various examples of which are described above with reference to FIG. 2. Second layer 410 includes one or more electrode materials, various examples of which are also described above. A combination of the resistive switching material of layer 408 and the electrode material of layer 410 facilitates resistive switching characteristics of ReRAM cells formed in later operations. In some embodiments (not shown in FIG. 4A), stack 403 also includes one or more layers disposed between first layer 408 and second layer 410, such as a current limiting layer.

Stack 403 is later patterned and etched to form ReRAM cells. This pattern may be determined by photoresist patterns 412a and 412b provided over second layer 410. Photoresist patterns 412a and 412b are typically aligned with electrode structures 406 to ensure that later formed portions (i.e., remaining portions of stack 403) are aligned with electrode structures 406. Photoresist patterns 412a and 412b may be formed during previous photolithographic operations. For example, a layer of photoresist may be spun on top of second layer 410. Using a photomask, some areas of the photoresist are exposed, while others are not. A developing process removes lithographically exposed photoresist parts, which forms exposed portions 416a-416c of stack or, more specifically, of second layer 410 (or any other top layer). This process also leaves behind photoresist patterns 412a and 412b that have not been exposed during lithographic processing. Only exposed portions 416a-416c of stack 403 will be subjected to etching in a subsequent operation, while photoresist patterns 412a and 412b will prevent etching portions of stack 403 provided under these patterns 412a and 412b.

After substrate 400 including stack 403 is provided into the processing chamber, the process may involve sealing the chamber and reducing its internal pressure to a low level to facilitate plasma etching ($10^{-3}$ to $10^{-8}$ range). During this conditioning and pressure stabilization of the processing apparatus, processing gases from gas sources connected to the chamber are allowed to flow into the chamber and to be evacuated. This operation stabilizes the chamber at a given pressure set point. Process gases may include etchants, such as $CF_4$, $CHF_3$, Ar, O2, $H_2$, $CH_4$, He, $C_2F_6$, $WF_6$, and $SF_6$. In some embodiments, an oxygen containing compound includes molecular oxygen. Tri-fluoro-methane is used because resistive switching materials of first layer 408 typically include metal oxides or, more specifically, oxides of the transitional metals. The process gases may also include hydrogen ($H_2$). In some embodiments, the process gases include an inert carrier gas, which may be helium, argon, and/or nitrogen.

In some embodiments, the process gases introduced into the chamber also include passivation gases that produce by-products that stick to the chamber walls or some other components away from the etching areas. The addition of such passivation gases is done either to control the etch profile on the individual wafers and/or to maintain a particular chamber condition.

After the chamber pressure has stabilized, the process gases continue to flow at a stabile flow rate in order to maintain the set pressure. In some embodiments, the flow rate of tri-fluoro-methane is greater than the flow rate of the one or more oxygen containing compounds. For example, the flow rate of tri-fluoro-methane is twice the flow rate of the oxygen containing compound.

An RF power source is activated, which marks the beginning of operation 304. The RF power source strikes the plasma to etch the stack on the substrate. A remote plasma source or a combination of remote and internal plasma sources may be used. The plasma creates activated fluorine and oxygen species. Several events occur within the processing chamber. First, the plasma activated etchant species etch portions of the stack, e.g., portions not covered by the photoresist. Second, volatile etching products are generated due to a chemical reaction between the activated etchant species and the material being etched. Third, these volatile etching products are evacuated from the processing chamber. These events continue for a sufficient period of time to complete the desired etch of the stack.

It should be noted that both first and second layers are etched during operation 304. In some embodiments, a ratio of a first layer etch rate to a second layer etch rate is between 0.1 and 10. For example, the first layer etch rate may be greater than the second layer etch rate or, more specifically, twice greater than the second layer etch rate. The etch rates of the first layer and/or of the second layer may be between about 20 Angstroms per minute and 120 Angstroms per minute or, more specifically, between about 40 Angstroms per minute and 100 Angstroms per minute. The etch rates depend on materials being etched (i.e., electrode and resistive switching materials, various examples of which are described above), etchant concentrations, types of etchants, surface temperature, and other factors. In some embodiments, etching is performed at room temperature, i.e., at a temperature of between 10° C. and 100° C.

Various techniques may be used to ensure that the etched surface stays free of residue while one or more passivation byproducts stick to the remaining portions formed during etching, i.e., to sidewalls of the gap formed during etching. This is done to prevent etching of the side walls of the formed portions and thereby controlling the vertical profile of the ReRAM cell. Ion assistance may be used to remove passivation byproducts from the etched surface. Such ion assistance may be provided by certain gases added to the etchant gases. Any byproducts that stick to the sidewalls may be removed in a subsequent cleaning operation.

The RF power may be between about 200 W and 1800 W. This power range depends on the following: chamber size, chamber purpose, and materials to be etched. Etching may be substantially isotropic by selecting specific etching chemistries and process conditions. In some embodiments, the chuck supporting the substrate may be biased. Biasing the chuck imparts some directionality to the etch plasma towards the substrate on the biased chuck.

Figure 4B:
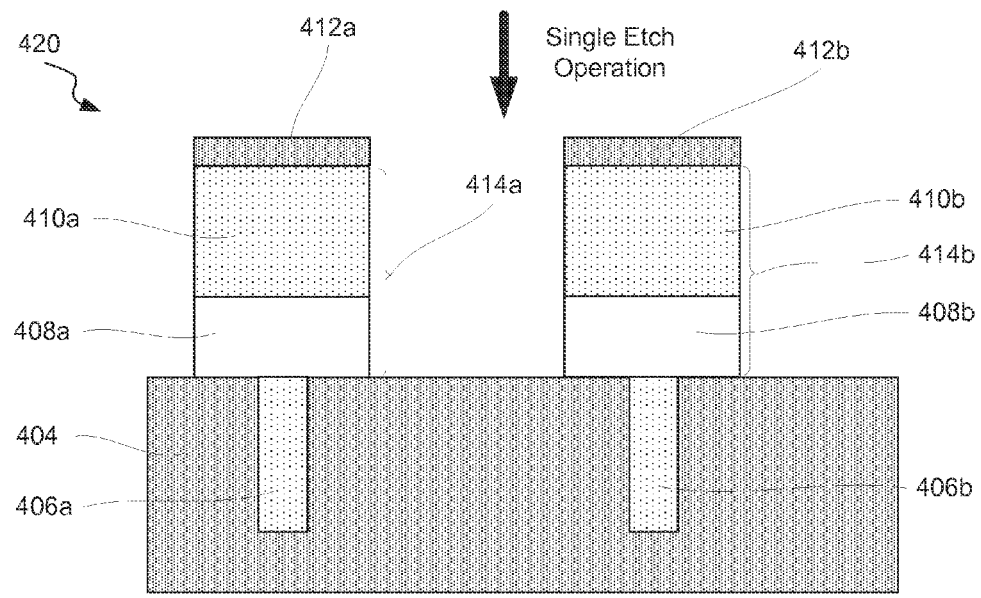

FIG. 4B illustrates a substrate 420 after completing the etching operation, in accordance with some embodiments. Portions of the stack not covered by photoresist patterns 412a and 412b are removed leaving remaining portions 414a and 414b and gaps between these remaining portions. Each of remaining portions 414a and 414b includes a part of the first layer (elements 408a and 408b) and a part of the second layer (elements 410a and 410b). Each of remaining portions 414a and 414b may cover a corresponding electrode structure (elements 406a and 406b). The profile of remaining portions 414a and 414b within the plane parallel to the substrate surface may be substantially larger than the profile of electrode structures 406a and 406b to ensure complete overlap. In some embodiments, the profile of electrode structures 406a and 406b determines the operating interface area between the bottom electrodes and resistive switching layers of ReRAM cells. Combinations of remaining portions 414a and 414b and electrode structures 406a and 406b form ReRAM cells, which may be organized as a memory array on substrate 404 as further described below.

In some embodiments, substantially all material between remaining portions 414a and 414b is removed during etching operation. Substrate 404 may act as an etch stop in these embodiments. Some removal of substrate 404 may be allowed. After etching, chemical vapor deposition (CVD) may be performed to fill gaps between remaining portions 414a and 414b.

Memory Array Examples

Figure 5A:
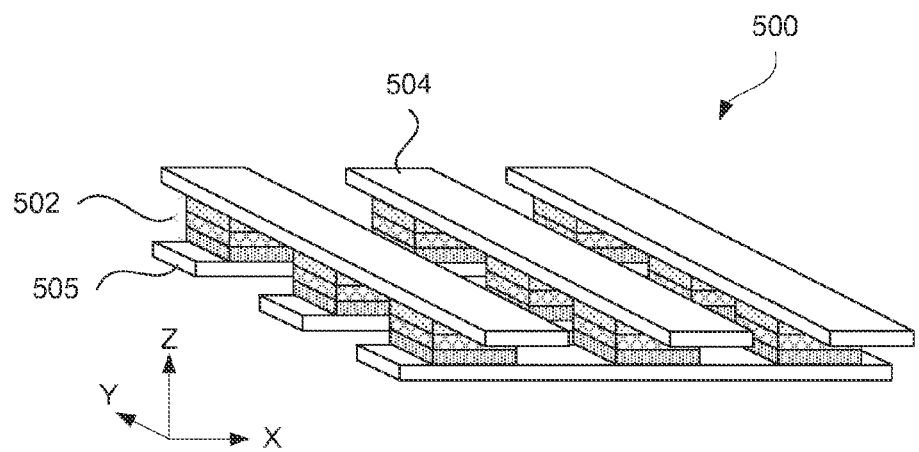
FIGS. 5A and 5B illustrate schematic views of memory arrays including multiple ReRAM cells, in accordance with some embodiments.

A brief description of memory arrays will now be described with reference to FIGS. 5A and 5B to provide better understanding to various aspects of thermally isolating structures provided adjacent to nonvolatile memory elements and, in some examples, surrounding the nonvolatile memory elements. Nonvolatile memory elements described above may be used in memory devices or larger integrated circuits (IC) that may take a form of arrays. FIG. 5A illustrates a memory array 500 including nine nonvolatile memory elements 502, in accordance with some embodiments. In general, any number of nonvolatile memory elements may be arranged into one array. Connections to each nonvolatile memory element 502 are provided by signal lines 504 and 505, which may be arranged orthogonally to each other. Nonvolatile memory elements 502 are positioned at crossings of signal lines 504 and 505 that typically define boundaries of each nonvolatile memory element in array 500.

Signal lines 504 and 505 are sometimes referred to as word lines and bit lines. These lines are used to read and write data into each nonvolatile memory element 502 of array 500 by individually connecting nonvolatile memory elements to read and write controllers. Individual nonvolatile memory elements 502 or groups of nonvolatile memory elements 502 can be addressed by using appropriate sets of signal lines 504 and 505. Each nonvolatile memory element 502 typically includes multiple layers, such as top and bottom electrodes, resistance switching layer, embedded resistors, embedded current steering elements, and the like, some of which are further described elsewhere in this document. In some embodiments, a nonvolatile memory element includes multiple resistance switching layers provided in between a crossing pair of signal lines 504 and 505.

As stated above, various read and write controllers may be used to control operations of nonvolatile memory elements 502. A suitable controller is connected to nonvolatile memory elements 502 by signal lines 504 and 505 and may be a part of the same memory device and circuitry. In some embodiments, a read and write controller is a separate memory device capable of controlling multiple memory devices each one containing an array of nonvolatile memory elements. Any suitable read and write controller and array layout scheme may be used to construct a memory device from multiple nonvolatile memory elements. In some embodiments, other electrical components may be associated with the overall array 500 or each nonvolatile memory element 502. For example, to avoid the parasitic-path-problem, i.e., signal bypasses by nonvolatile memory elements in their low resistance state (LRS), serial elements with a particular non-linearity must be added at each node or, more specifically, into each element. Depending on the switching scheme of the nonvolatile memory element, these elements can be diodes or varistor-type elements with a specific degree of non-linearity. In the same other embodiments, an array is organized as an active matrix, in which a transistor is positioned at each node or, more specifically, embedded into each cell to decouple the cell if it is not addressed. This approach significantly reduces crosstalk in the matrix of the memory device.

Figure 5B:
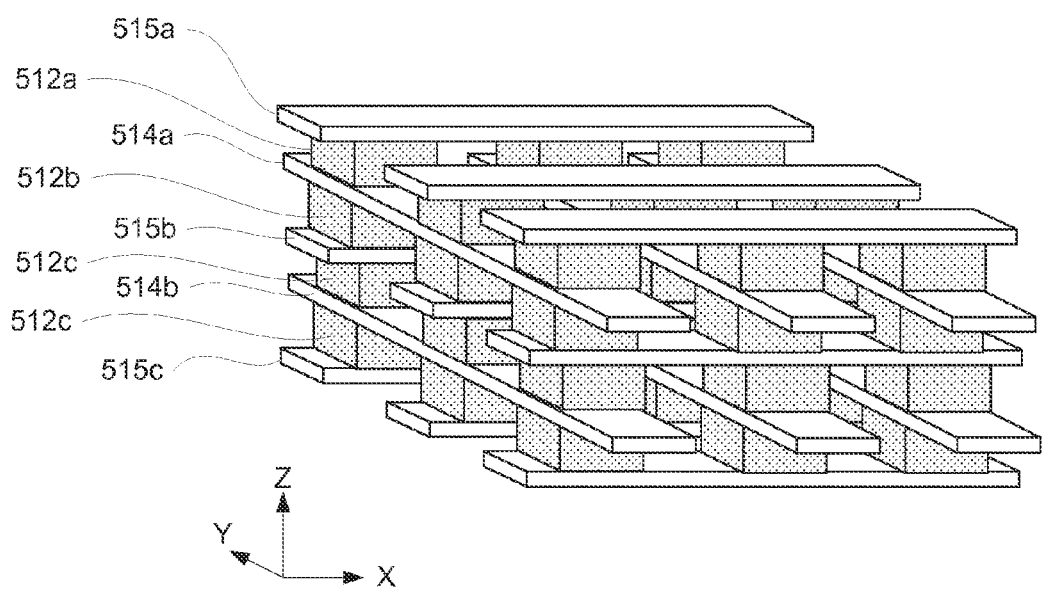

In some embodiments, a memory device may include multiple array layers as, for example, illustrated in FIG. 5B. In this example, five sets of signal lines 514a-b and 515a-c are shared by four ReRAM arrays 512a-c. As with the previous example, each ReRAM array is supported by two sets of signal lines, e.g., array 512a is supported by 514a and 515a. However, middle signal lines 514a-b and 515b, each is shared by two sets ReRAM arrays. For example, signal line set 514a provides connections to arrays 512a and 512b. Top and bottom sets of signal lines 515a and 515c are only used for making electrical connections to one array. This 3-D arrangement of the memory device should be distinguished from various 3-D arrangements in each individual nonvolatile memory element.

High Productivity Combinatorial (HPC) Examples

"Combinatorial Processing" generally refers to techniques of differentially processing multiple regions of one or more substrates. Combinatorial processing generally varies materials, unit processes or process sequences across multiple regions on a substrate. The varied materials, unit processes, or process sequences can be evaluated (e.g., characterized) to determine whether further evaluation of certain process sequences is warranted or whether a particular solution is suitable for production or high volume manufacturing.

Figure 6A:
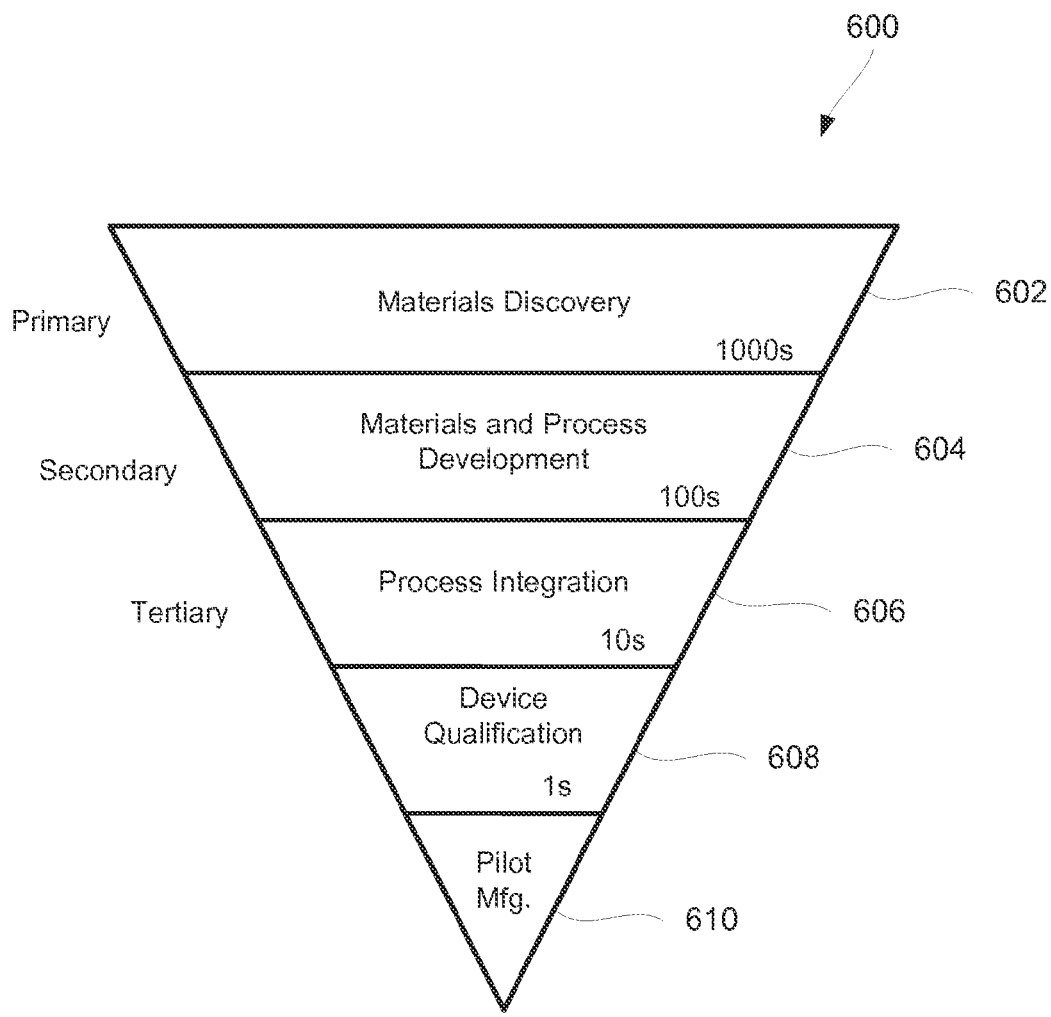
FIG. 6A illustrates a schematic diagram for implementing combinatorial processing and evaluation using primary, secondary, and tertiary screening, in accordance with some embodiments.

FIG. 6A illustrates a schematic diagram for implementing combinatorial processing and evaluation using primary, secondary, and tertiary screening, in accordance with some embodiments. Specifically, diagram 600 illustrates that the relative number of combinatorial processes run with a group of substrates decreases as certain materials and/or processes are selected. Generally, combinatorial processing includes performing a large number of processes during a primary screen, selecting promising candidates from those processes, performing the selected processing during a secondary screen, selecting promising candidates from the secondary screen for a tertiary screen, and so on. In addition, feedback from later stages to earlier stages can be used to refine the success criteria and provide better screening results.

For example, thousands of materials are evaluated during a materials discovery stage 602. Materials discovery stage 602 is also known as a primary screening stage performed using primary screening techniques. Primary screening techniques may include dividing substrates into coupons and depositing materials using varied processes. The materials are then evaluated, and promising candidates are advanced to the secondary screen, or materials and process development stage 104. Evaluation of the materials is performed using metrology tools such as electronic testers and imaging tools (i.e., microscopes).

Materials and process development stage 604 may evaluate hundreds of materials (i.e., a magnitude smaller than the primary stage) and may focus on the processes used to deposit or develop those materials. Promising materials and processes are again selected, and advanced to the tertiary screen or process integration stage 606, where tens of materials and/or processes and combinations are evaluated. Tertiary screen or process integration stage 106 may focus on integrating the selected processes and materials with other processes and materials.

The most promising materials and processes from the tertiary screen are advanced to device qualification 608. In device qualification, the materials and processes selected are evaluated for high volume manufacturing, which normally is conducted on full substrates within production tools, but need not be conducted in such a manner. The results are evaluated to determine the efficacy of the selected materials and processes. If successful, the use of the screened materials and processes can proceed to pilot manufacturing 610.

Diagram 600 is an example of various techniques that may be used to evaluate and select materials and processes for the development of new materials and processes. The descriptions of primary, secondary, etc. screening and the various stages 602-610 are arbitrary and the stages may overlap, occur out of sequence, be described and be performed in many other ways. Additional aspects of High Productivity Combinatorial (HPC) techniques are described in U.S. patent application Ser. No. 11/674,137, filed on Feb. 12, 2007, which is hereby incorporated by reference in its entirety for purposed of describing HPC techniques.

The embodiments described further analyze a portion or sub-set of the overall process sequence used to manufacture a semiconductor device. Once the subset of the process sequence is identified for analysis, combinatorial process sequence integration testing is performed to optimize the materials, unit processes, hardware details, and process sequence used to build that portion of the device or structure. During the processing of some embodiments described herein, structures are formed on the processed substrate. For example, such structures may include, but would not be limited to, ReRAM cell components, such as electrodes, resistive switching layers, coupling layers, and the like. While the combinatorial processing varies certain materials, unit processes, hardware details, or process sequences, the composition or thickness of the layers or structures or the action of the unit process, such as cleaning, surface preparation, deposition, surface treatment, etc. is substantially uniform through each discrete region. Furthermore, while different materials or unit processes may be used for corresponding layers or steps in the formation of a structure in different regions of the substrate during the combinatorial processing, the application of each layer or use of a given unit process is substantially consistent or uniform throughout the different regions in which it is intentionally applied. Thus, the processing is uniform within a region (inter-region uniformity) and between regions (intra-region uniformity), as desired. It should be noted that the process can be varied between regions, for example, where a thickness of a layer is varied or a material may be varied between the regions, etc., as desired by the design of the experiment.

The result is a series of regions on the substrate that contain structures or unit process sequences that have been uniformly applied within that region and, as applicable, across different regions. This process uniformity allows comparison of the properties within and across the different regions such that the variations in test results are due to the varied parameter (e.g., materials, unit processes, unit process parameters, hardware details, or process sequences) and not the lack of process uniformity. In the embodiments described herein, the positions of the discrete regions on the substrate can be defined as needed, but are preferably systematized for ease of tooling and design of experimentation. In addition, the number, variants and location of structures within each region are designed to enable valid statistical analysis of the test results within each region and across regions to be performed.

Figure 6B:
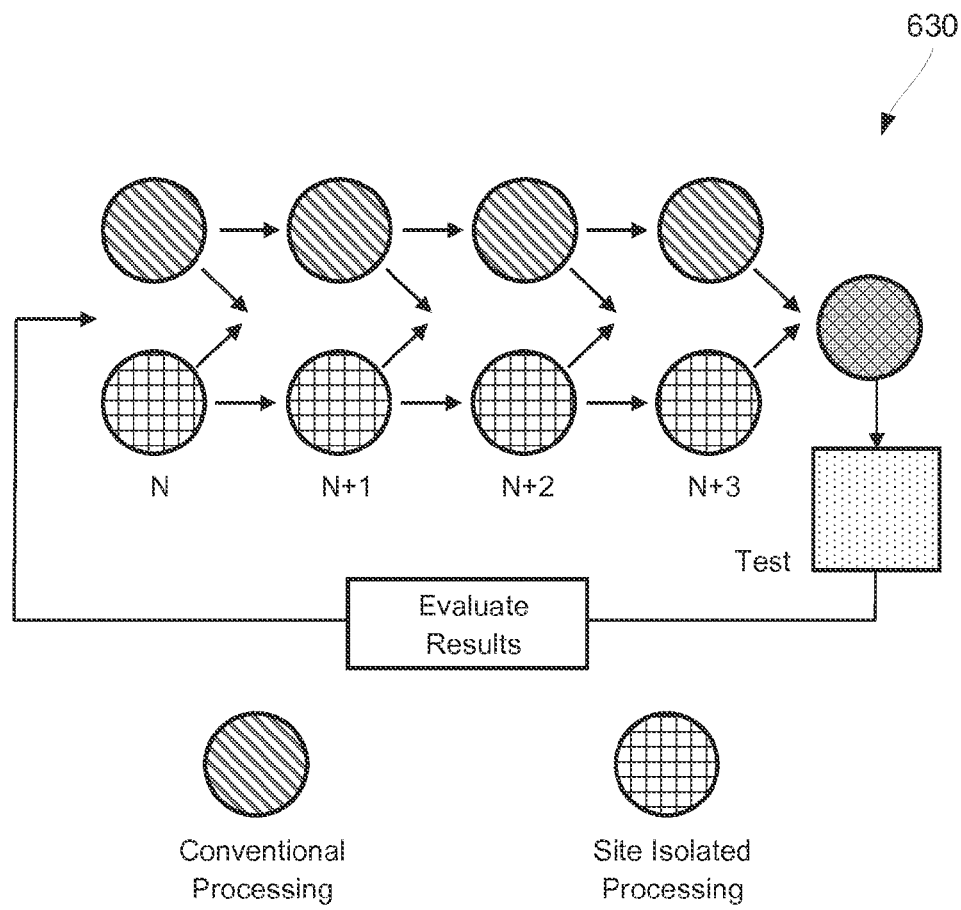
FIG. 6B is a simplified schematic diagram illustrating a methodology for combinatorial process sequence integration that includes site isolated processing and/or conventional processing, in accordance with some embodiments.

FIG. 6B is a simplified schematic diagram illustrating a general methodology for combinatorial process sequence integration that includes site isolated processing and/or conventional processing, in accordance to some embodiments. In some embodiments, the substrate is initially processed using conventional process N. In some embodiments, the substrate is then processed using site isolated process N+1. During site isolated processing, an HPC module may be used, some examples of which are described below. The substrate can then be processed using site isolated process N+2, and thereafter processed using conventional process N+3. Testing is performed and the results are evaluated. The testing can include physical, chemical, acoustic, magnetic, electrical, optical, etc. tests. From this evaluation, a particular process from the various site isolated processes (e.g. from steps N+1 and N+2) may be selected and fixed so that additional combinatorial process sequence integration may be performed using site isolated processing for either process N or N+3. For example, a next process sequence can include processing the substrate using site isolated process N, conventional processing for processes N+1, N+2, and N+3, with testing performed thereafter.

It should be appreciated that various other combinations of conventional and combinatorial processes can be included in the processing sequence with regard to FIG. 6B. That is, the combinatorial process sequence integration can be applied to any desired segments and/or portions of an overall process flow. Characterization, including physical, chemical, acoustic, magnetic, electrical, optical, etc. testing, can be performed after each process operation, and/or series of process operations within the process flow as desired. The feedback provided by the testing is used to select certain materials, processes, process conditions, and process sequences and eliminate others. Furthermore, the above flows can be applied to entire monolithic substrates, or portions of monolithic substrates such as coupons.

Under combinatorial processing operations the processing conditions at different regions can be controlled independently. Consequently, process material amounts, reactant species, processing temperatures, processing times, processing pressures, processing flow rates, processing powers, processing reagent compositions, the rates at which the reactions are quenched, deposition order of process materials, process sequence steps, hardware details, etc., can be varied from region to region on the substrate. Thus, for example, when exploring materials, a processing material delivered to a first and second region can be the same or different. If the processing material delivered to the first region is the same as the processing material delivered to the second region, this processing material can be offered to the first and second regions on the substrate at different concentrations. In addition, the material can be deposited under different processing parameters. Parameters which can be varied include, but are not limited to, process material amounts, reactant species, processing temperatures, processing times, processing pressures, processing flow rates, processing powers, processing reagent compositions, the rates at which the reactions are quenched, atmospheres in which the processes are conducted, an order in which materials are deposited, hardware details of the gas distribution assembly, etc. It should be appreciated that these process parameters are exemplary and not meant to be an exhaustive list as other process parameters commonly used in semiconductor manufacturing may be varied.

As mentioned above, within a region, the process conditions are substantially uniform, in contrast to gradient processing techniques which rely on the inherent non-uniformity of the material deposition. That is, the embodiments, described herein locally perform the processing in a conventional manner, e.g., substantially consistent and substantially uniform, while globally over the substrate, the materials, processes, and process sequences may vary. Thus, the testing will find optimums without interference from process variation differences between processes that are meant to be the same. It should be appreciated that a region may be adjacent to another region in one embodiment or the regions may be isolated and, therefore, non-overlapping. When the regions are adjacent, there may be a slight overlap wherein the materials or precise process interactions are not known, however, a portion of the regions, normally at least 50% or more of the area, is uniform and all testing occurs within that region. Further, the potential overlap is only allowed with material of processes that will not adversely affect the result of the tests. Both types of regions are referred to herein as regions or discrete regions.

Combinatorial processing can be used to produce and evaluate different materials, chemicals, processes, process and integration sequences, and techniques related to semiconductor fabrication. For example, combinatorial processing can be used to determine optimal processing parameters (e.g., power, time, reactant flow rates, temperature, etc.) of dry processing techniques such as dry etching (e.g., plasma etching, flux-based etching, reactive ion etching (RIE)) and dry deposition techniques (e.g., physical vapor deposition (PVD), chemical vapor deposition (CVD), atomic layer deposition (ALD), etc.). Combinatorial processing can be used to determine optimal processing parameters (e.g., time, concentration, temperature, stirring rate, etc.) of wet processing techniques such as wet etching, wet cleaning, rinsing, and wet deposition techniques (e.g., electroplating, electroless deposition, chemical bath deposition, etc.).

CONCLUSION

Although the foregoing examples have been described in some detail for purposes of clarity of understanding, the invention is not limited to the details provided. There are many alternative ways of implementing the invention. The disclosed examples are illustrative and not restrictive.

What is claimed is:

1. A method of forming a resistive random access memory cell, the method comprising:
   providing a semiconductor structure,
   wherein the structure comprises,
      a substrate,
      a first layer disposed over the substrate and comprising a resistive switching material,
      a second layer disposed over the first layer and comprising an electrode material,
      the first layer and the second layer forming a stack;
   generating a plasma from gases comprising tri-fluoromethane and an oxygen containing compound; and
   removing portions of the stack using the plasma.

2. The method of claim 1, wherein a ratio of a first layer etch rate to a second layer etch rate is between 0.1 and 10.

3. The method of claim 2, wherein the first layer etch rate and the second layer etch rate are each between 20 Angstroms per minute and 120 Angstroms per minute.

4. The method of claim 2, wherein the first layer etch rate is greater than the second layer etch rate.

5. The method of claim 1, wherein the oxygen containing compound comprises molecular oxygen.

6. The method of claim 1, wherein the removing is performed at a temperature of between 20° C. and 30° C.

7. The method of claim 1, wherein a flow rate of tri-fluoro-methane is greater than a flow rate of the oxygen containing compound.

8. The method of claim 7, wherein the flow rate of tri-fluoro-methane is twice the flow rate of the oxygen containing compound.

9. The method of claim 1, wherein the resistive switching material comprises one or more of hafnium oxide, titanium oxide, aluminum oxide, zirconium oxide, niobium oxide, tantalum oxide, or yttrium oxide.

10. The method of claim 1, wherein the electrode material comprises one or more of titanium nitride, platinum, or ruthenium.

11. The method of claim 1, wherein the resistive switching material comprises hafnium oxide and wherein the electrode material comprises titanium nitride.

12. The method of claim 1, wherein the stack further comprises a third layer disposed between the first layer and the second layer.

13. The method of claim 12, wherein the third layer comprises a current limiter material.

14. The method of claim 1, wherein the substrate further comprises electrode materials, and wherein each of remaining portions of the stack is positioned over one of the electrode materials.

15. The method of claim 14, wherein the electrode materials comprise doped polysilicon.

16. The method of claim 14, wherein each of the remaining portions of the stack fully covers one of the electrode materials.

17. The method of claim 1, wherein the first layer has a thickness of between 20 Angstroms and 400 Angstroms.

18. The method of claim 1, wherein the second layer has a thickness of between 400 Angstroms and 1200 Angstroms.

19. A method of forming a resistive random access memory cell, the method comprising:
   providing a substrate, the substrate supporting a stack,
      wherein the stack comprises a first layer, a second layer, and electrode structures,
      wherein the electrode structures comprise doped polysilicon,
      wherein the first layer comprises one or more of hafnium oxide, titanium oxide, aluminum oxide, zirconium oxide, niobium oxide, tantalum oxide, or yttrium oxide,
      wherein the first layer has a thickness of between 20 Angstroms and 400 Angstroms,
      wherein the second layer comprises one or more of titanium nitride, platinum, or ruthenium,
      wherein the second layer has a thickness of between 400 Angstroms and 1200 Angstroms;
   generating a plasma from gases comprising tri-fluoro-methane and an oxygen containing compound,
      wherein a flow rate of tri-fluoro-methane is greater than a flow rate of the oxygen containing compound; and
   removing portions of the stack using the plasma,
      wherein the removed portions of the stack expose a part of the substrate,
      wherein remaining portions of the stack fully cover one of the electrode structures.

* * * * *